United States Patent
Oon et al.

(10) Patent No.: US 7,841,747 B2
(45) Date of Patent: Nov. 30, 2010

(54) LIGHT EMITTING DEVICE

(75) Inventors: Siang Ling Oon, Bukit Mertajam (MY); Ju Chin Poh, Bayan Lepas (MY); Boon Keat Tan, Gelugor (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 43 days.

(21) Appl. No.: 12/333,076

(22) Filed: Dec. 11, 2008

(65) Prior Publication Data

US 2010/0149819 A1  Jun. 17, 2010

(51) Int. Cl.
*H01L 27/15* (2006.01)
*F21V 7/00* (2006.01)
*F21V 29/00* (2006.01)

(52) U.S. Cl. .................. 362/296.01; 362/341; 362/350; 362/294; 257/98

(58) Field of Classification Search ............ 362/296.01, 362/327, 328, 341, 800, 350, 545, 612, 294; 257/98, 79, 13

See application file for complete search history.

(56) References Cited

U.S. PATENT DOCUMENTS

| | | | |
|---|---|---|---|
| 6,274,924 B1 | 8/2001 | Carey et al. | |
| 6,480,389 B1 | 11/2002 | Shie et al. | |
| 6,707,069 B2 * | 3/2004 | Song et al. | 257/79 |
| 7,038,195 B2 * | 5/2006 | Kida et al. | 250/239 |
| 7,119,422 B2 | 10/2006 | Chin | |
| 7,128,444 B2 * | 10/2006 | Isokawa et al. | 362/311.02 |
| 7,344,902 B2 | 3/2008 | Basin et al. | |
| 2002/0153835 A1 * | 10/2002 | Fujiwara et al. | 313/512 |
| 2006/0284207 A1 | 12/2006 | Park et al. | |
| 2007/0041186 A1 * | 2/2007 | Tan et al. | 362/240 |
| 2007/0291490 A1 | 12/2007 | Tajul et al. | |
| 2008/0025030 A9 * | 1/2008 | Lee et al. | 362/310 |

FOREIGN PATENT DOCUMENTS

WO  WO/2006/123917  11/2006

\* cited by examiner

*Primary Examiner*—Jacob Y Choi

(57) ABSTRACT

A light emitting device is disclosed herein which includes a substrate, a housing, a light emitting die, and a cup with a reflective inner surface. The housing has an upper surface and at least one sidewall and is mounted on the upper surface of the substrate, thereby forming a cavity. The light emitting die is mounted on the upper surface of the substrate within the cavity. The cup is positioned within the cavity and is supported by the housing. The cup has a continuous sidewall with a reflective inner surface surrounding the light emitting die and a lowermost edge that is suspended above, detached and spaced away from the upper surface of the substrate.

6 Claims, 7 Drawing Sheets

LIGHT EMITTING DEVICE

BACKGROUND

In solid state lighting applications such as those that utilize light emitting diodes (LEDs), it is important to have high brightness output and consistent light output performance over a long period of time. An LED package may be provided with anode and cathode connections that place the LED die in communication with an electrical circuit for supplying a bias voltage to the LED die. An LED package may also include phosphors to produce a white light emitting source using a colored LED die. The LED die may be positioned within a cup-shaped cavity of a housing in order to provide an initial focus for light output from the LED die. In order to increase light output from the LED device, the cavity may have reflective sidewalls. For example, with a housing manufactured from a plastic material such as polyphthalamide (PPA), the reflective sidewalls may be white.

Along with light output, LED devices also generate heat. Junction temperature refers to the highest temperature generated by the LED device, which typically occurs at the junction between the LED device and the substrate on which it is mounted. High junction temperatures can quickly degrade a plastic housing and cause white reflective sidewalls to turn yellow, thereby reducing their reflectivity and decreasing the light output of the LED package.

DETAILED DESCRIPTION

Figure 1:
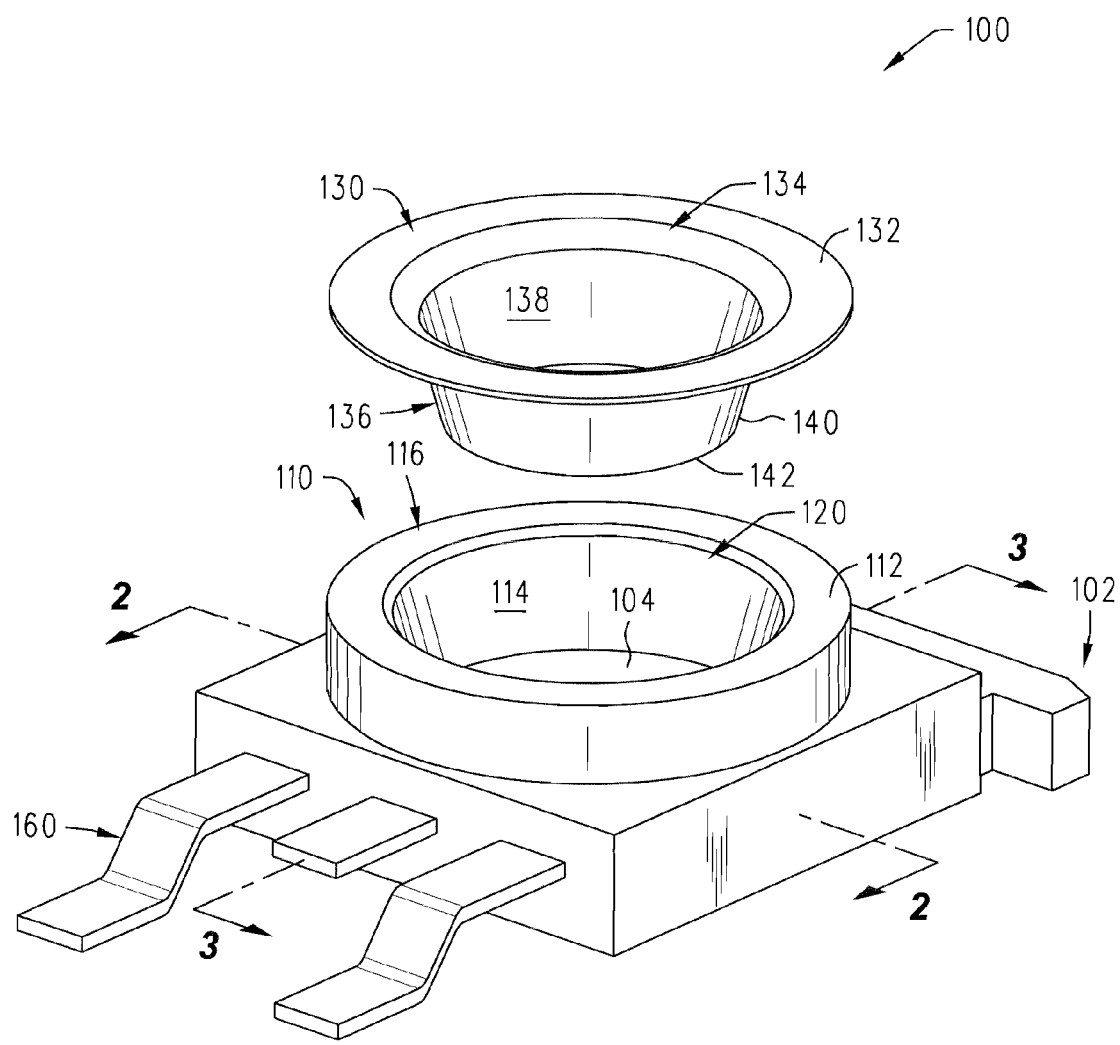
FIG. 1 is an isometric, partially exploded view of an embodiment of a light emitting device.
Figure 2:
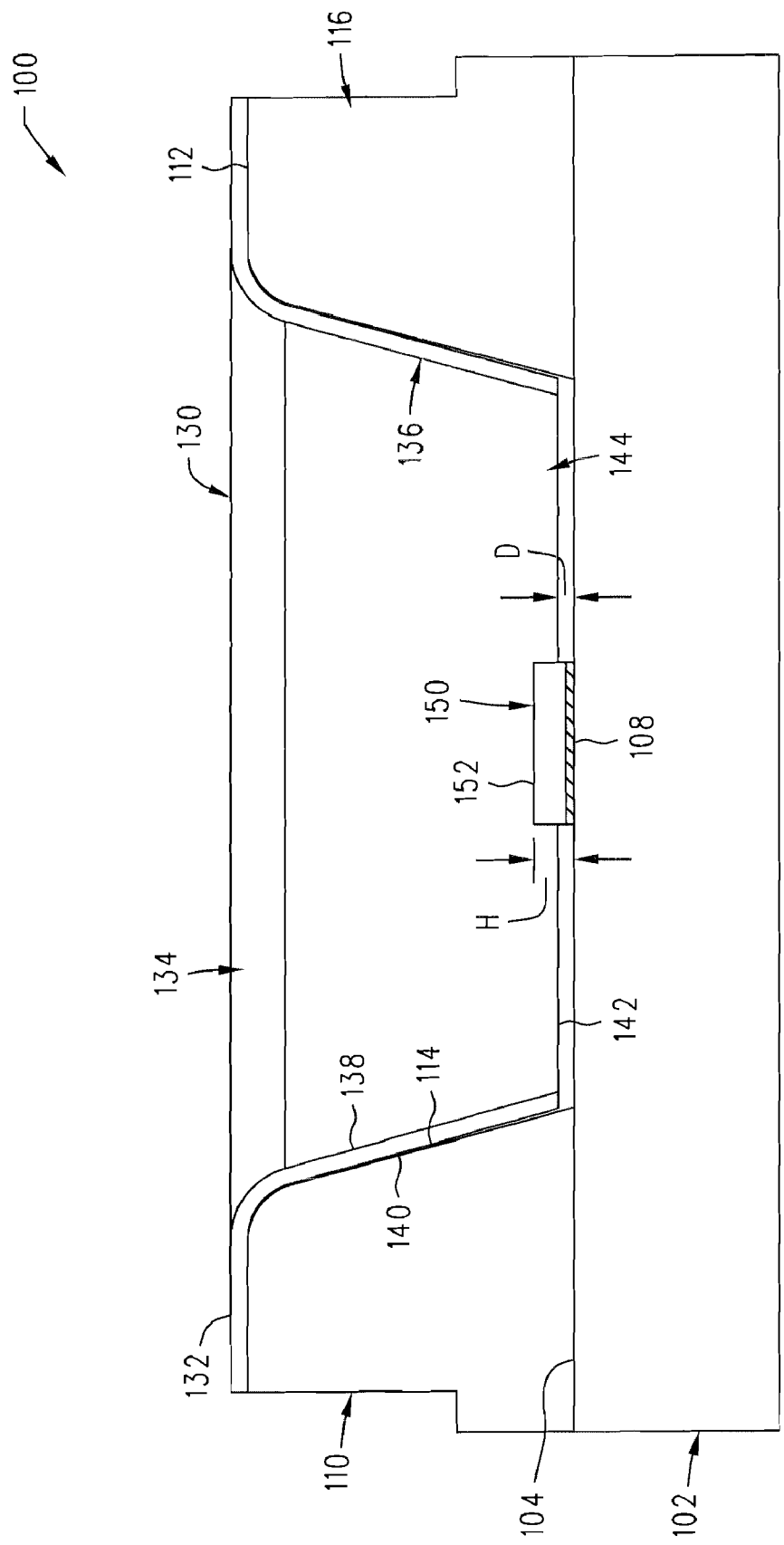
FIG. 2 is a sectional view of the light emitting device of FIG. 1.
Figure 3:
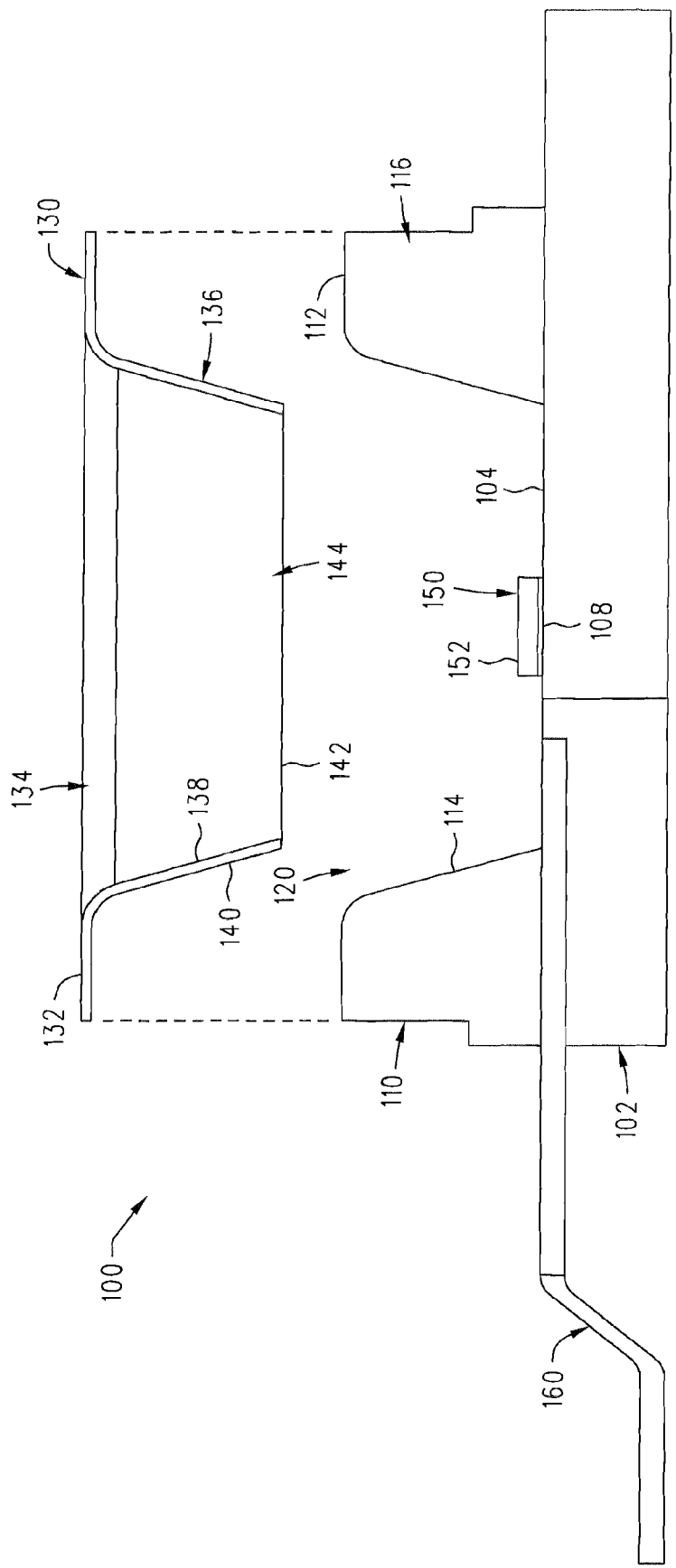
FIG. 3 is a sectional, partially exploded view of the light emitting device of FIG. 1.

An embodiment of a light emitting device 100 is shown in FIGS. 1-3. In summary, the light emitting device 100 comprises a substrate 102 with a housing 110 mounted thereon, thereby forming a cavity 120. A cup 130 with a reflective inner surface 138 is positioned within the cavity 120. The cup 130 is supported by the housing 110 such that it does not contact the substrate 102. A light emitting die 150 is mounted on the substrate 102 within the cavity 120 and is surrounded by the reflective inner surface 138 of the cup 130.

The substrate 102 may have an upper surface 104 and one or more conductive portions 108 thereon. The light emitting die 150 may be mounted on a conductive portion 108 as shown in FIGS. 2 and 3. The substrate 102 shown in FIGS. 1-3 is of the type generally known as a "leadframe" whereby conductive leads 160 that are electrically connected to the light emitting die 150 extend therefrom. Alternatively (not shown), the substrate 102 may be a flexible circuit, ceramic, a printed circuit board, or any other medium on which a light emitting die 150 may be mounted.

The housing 110 may have an upper surface 112 and an inner surface 114 of at least one laterally extending sidewall 116. The housing 110 is mounted on the substrate 102 such that the laterally extending sidewall 116 forms a cavity 120. Alternatively (not shown), the substrate 102 and housing 110 may be formed as a single unit having a cavity 120, such as by injection molding, for example. The light emitting die 150 is mounted on the upper surface 104 of the substrate 102 within the cavity 120, as shown in FIGS. 2 and 3. The housing 110 may be manufactured from a plastic material such as, for example, polyphthalamide (PPA).

The cup 130 may have an upper lip 132 surrounding an open top 134, and a continuous sidewall 136 having an inner surface 138, an outer surface 140, and a lowermost edge 142. In this embodiment, the inner surface 114 of the sidewall 116 of the housing 110 generally conforms to the outer surface 140 of the sidewall 136 of the cup 130. The inner surface 138 of the cup 130 is reflective in order to maximize the light output from the light-emitting die 150. This may be accomplished by coating the inner surface 138 of the cup 130 with a highly-reflective metal material such as, for example, silver. The cup 130 itself may also be manufactured from a metal material such as, for example, aluminum, steel, or the like. The cup 130 may alternatively be manufactured from a plastic material such as, for example, polyphthalamide (PPA), liquid crystal polymer (LCP), and the like.

The lowermost edge 142 of the cup 130 may circumferentially surround an open bottom 144. When the cup 130 is positioned within the cavity 120 of the housing 110 as shown in FIGS. 2 and 3, the upper lip 132 of the cup 130 is supported by the upper surface 112 of the housing 110. The lowermost edge 142 of the cup 130 is suspended above, detached, and spaced away a distance "D" from the upper surface 104 of the substrate 102. The spacing prevents the metallized cup 130 from coming into electrical contact with conductive portions (e.g., 108) on the substrate 102. The light emitting die 150 may be any LED that is mountable on a substrate. If a colored LED is utilized, phosphors (not shown) may be included in the light emitting package 100 to produce white light output. The light emitting die 150 has a height "H" that is measured from the upper surface 152, through which light is emitted, thereof to the upper surface 104 of the substrate 102. Referring to FIG. 2, in order to maximize the light output from the light emitting device 100, the height "H" of the light emitting die 150 is preferably larger than the distance "D" such that the lowermost edge 142 of the cup 130 extends lower than the upper surface 152 of the light emitting die 150. For example, the height "H" may be within the range of approximately 0.1 to 0.2 mm, while the distance "D" may be within the range of approximately 0.01 to 0.1 mm.

Figure 4:
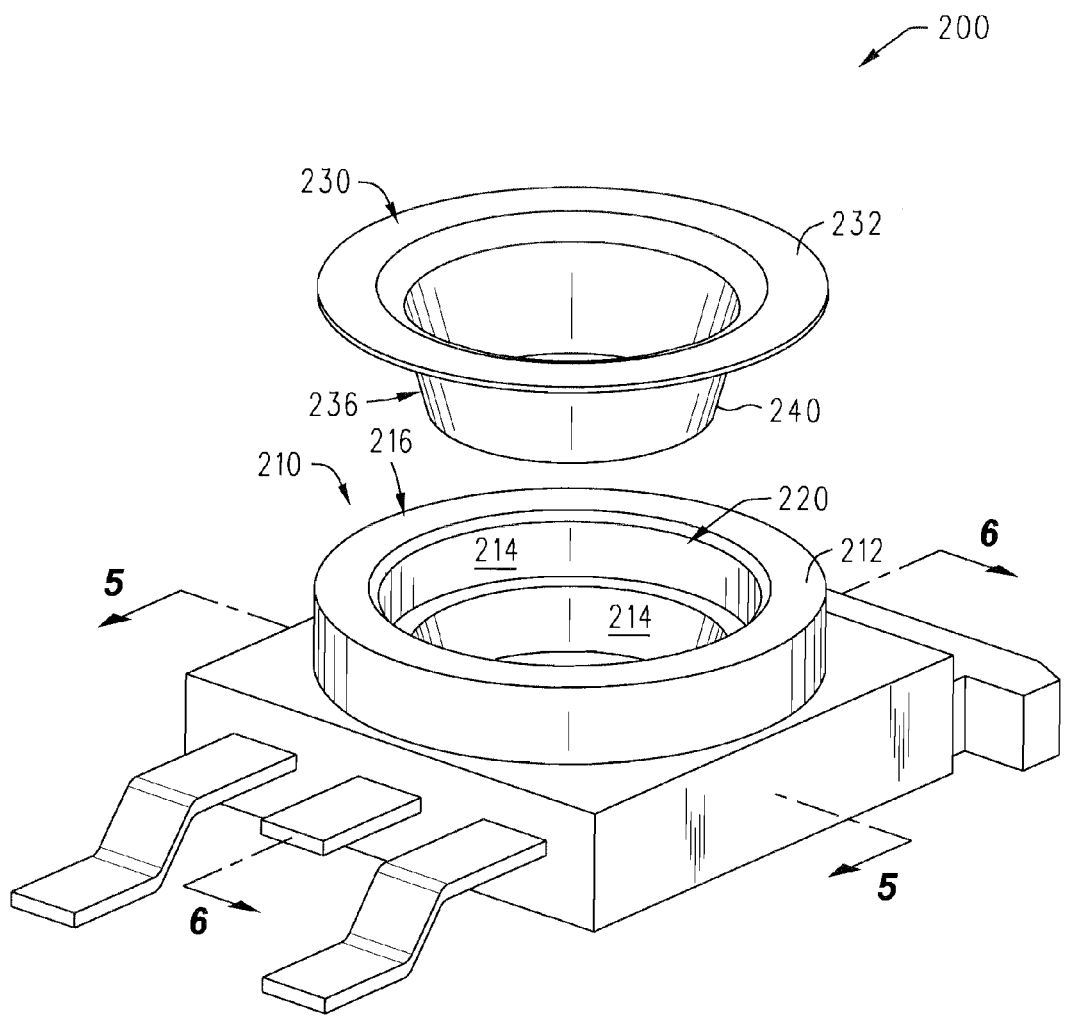
FIG. 4 is an isometric, partially exploded view of another embodiment of a light emitting device.
Figure 5:
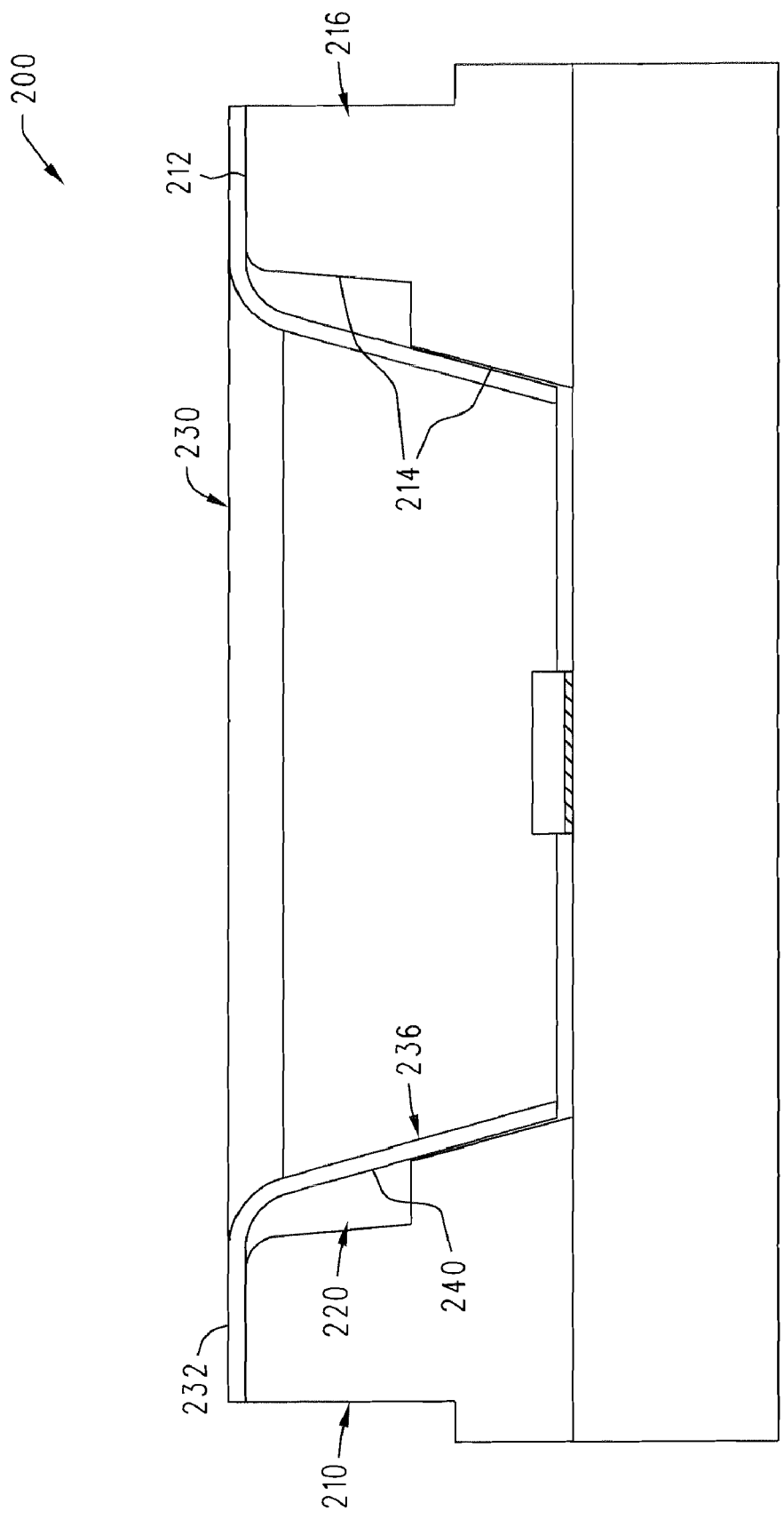
FIG. 5 is a sectional view of the light emitting device of FIG. 4.
Figure 6:
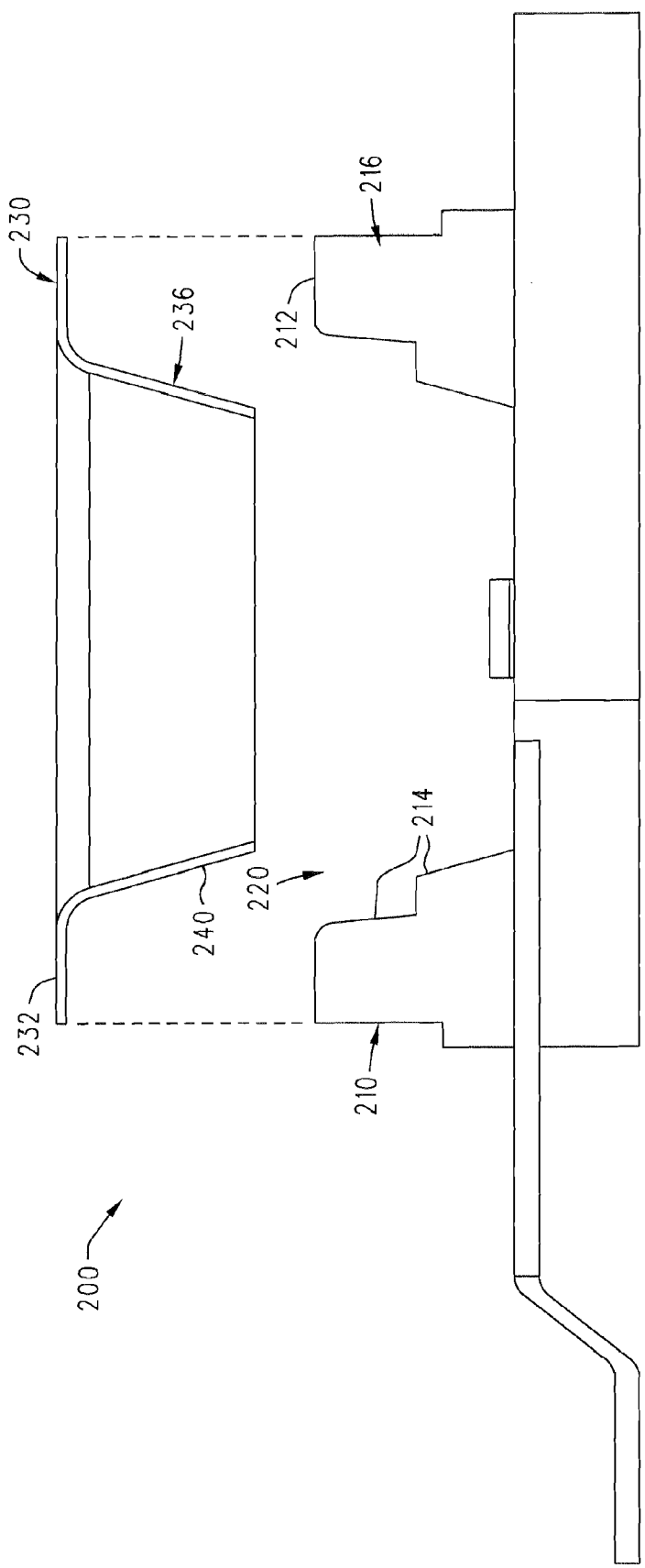
FIG. 6 is a sectional, partially exploded view of the light emitting device of FIG. 4.

Another embodiment of a light emitting device 200 is shown in FIGS. 4-6. As shown, the housing 210 may have a different configuration than that shown in FIGS. 1-3. Specifically, the inner surface 214 of the housing 210 laterally extending sidewall 216 need not conform to the outer surface 240 of the sidewall 236 of the cup 230 since the cup 230 is supported at its upper lip 232 by the upper surface 212 of the housing 210. This allows the cup 230 to be utilized in an existing light emitting device package that may not have a cup-shaped cavity 220. For example, the inner surface 214 of the sidewall 216 of the housing 210 may be irregular such as that shown in FIGS. 4-6. It is to be understood that the laterally extending sidewall 216 of the housing 210, may be, but need not be continuous so long as the upper surface 212 has a sufficient area for supporting the upper lip 232 of the cup 230. Other than the shape of the housing 210, this embodiment of the light emitting device 200 is identical to the light emitting device 100 described above and shown in FIGS. 1-3.

Figure 7:
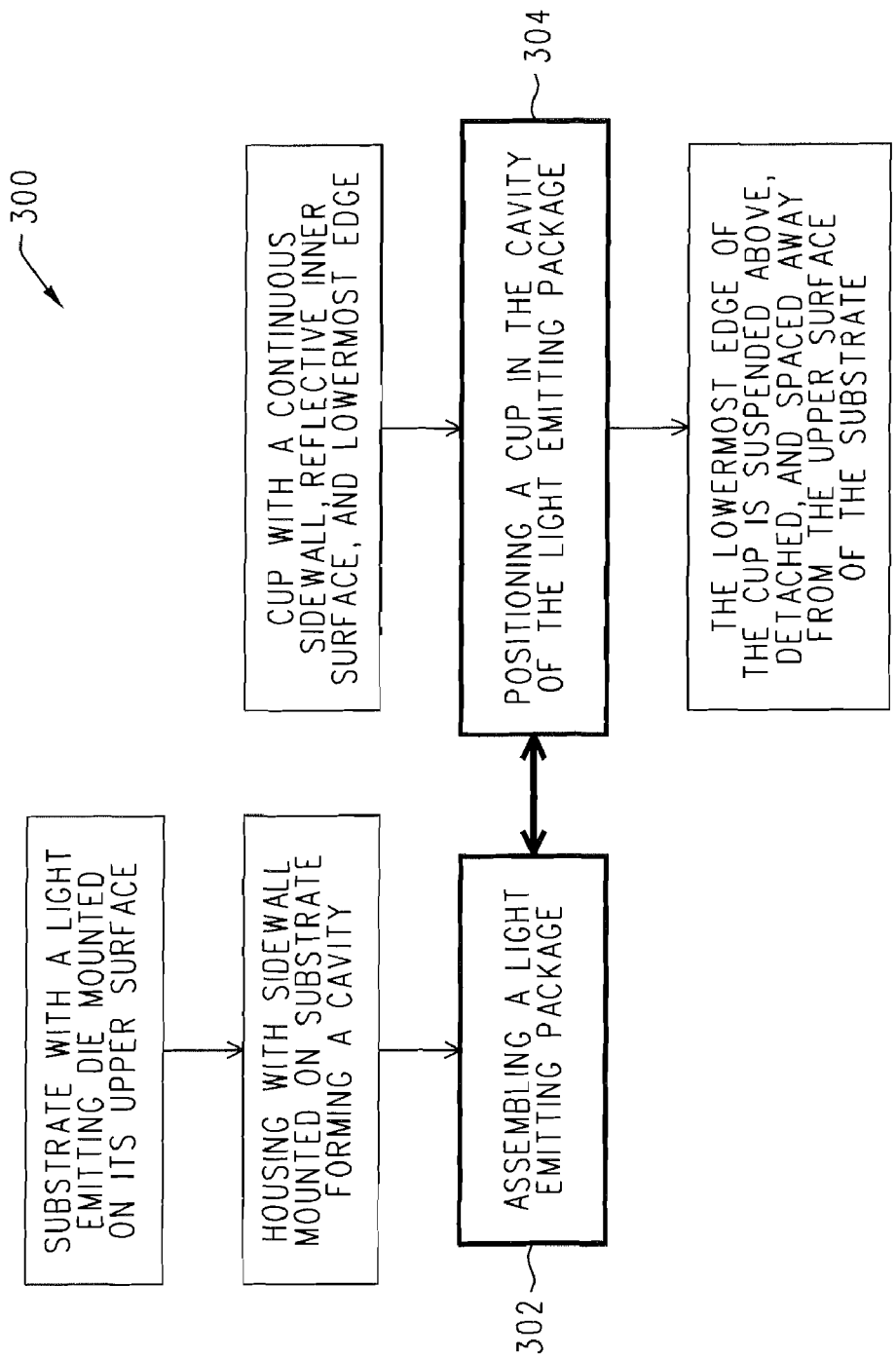
FIG. 7 is a flow diagram illustrating a method for assembling the light emitting device of FIGS. 1-6.

A method 300 for assembling a light emitting device is illustrated in the flow diagram of FIG. 7. Specifically, and with reference to FIGS. 1-6, a light emitting package 100, 200 may be assembled (step 302) that includes a substrate 102 having an upper surface 104, a light emitting device 150 mounted on the upper surface 104 of the substrate 102 (which may be mounted on a conductive portion 108 thereof as shown in FIGS. 2-3 and 5-6), and a housing 110, 210 having an upper surface 112, 212 and at least one sidewall 116, 216. The housing 110, 210 is mounted on the upper surface 104 of the substrate 102, thereby forming a cavity 120, 220 within which the light emitting die 150 is mounted. At any time before, during or after the light emitting package 100, 200 is assembled (as indicated by the two-way arrow in FIG. 7), a cup 130 is positioned within the cavity 120, 220 (step 304) such that the cup 130, 230 is supported by the housing 110, 210. In other words, the cup 130, 230 may be lowered into the cavity 120, 220 until the upper lip 132, 232 of the cup 130, 230 comes into contact with and is then supported by the upper surface 112, 212 of the housing 110, 210. As described above relative to FIGS. 1-3, the cup 130, 230 has a continuous sidewall 136, 236 with a reflective inner surface 138 surrounding the light emitting die 150 and a lowermost edge 142 that is suspended above, detached and spaced away from the upper surface 104 of the substrate 102.

While illustrative and presently preferred embodiments have been described in detail herein, it is to be understood that the inventive concepts may be otherwise variously embodied and employed, and that the appended claims are intended to be construed to include such variations, except as limited by the prior art.

What is claimed is:

1. A light emitting device, comprising
    a substrate having an upper surface;
    a housing having an upper surface and at least one sidewall, wherein the housing is mounted on the substrate thereby forming a cavity;
    a light emitting die mounted on the upper surface of the substrate within the cavity;
    a cup positioned within the cavity and supported by the housing, the cup having a continuous sidewall with a reflective inner surface surrounding the light emitting die and a lowermost edge that is suspended above, detached and spaced away from the upper surface of the substrate, wherein;
    the light emitting die has an upper surface through which light is emitted and a height that is measured from the upper surface of the substrate to the upper surface of the light emitting die; and
    a distance that the lowermost edge of the cup is spaced away from the upper surface of the substrate is less than the height of the light emitting die, wherein the lowermost edge of the cup is positioned substantially below the upper surface of the light emitting die;
    wherein the sidewall of the housing has a generally truncated, inverted-cone shaped inner surface and the sidewall of the cup has an outer surface, and the inner surface of the sidewall of the housing corresponds to the outer surface of the sidewall of the cup whereby heat dissipation through the sidewall of the cup is facilitated.

2. The light emitting device of claim 1, wherein the cup further comprises an upper lip surrounding an open top, the upper lip being supported by the upper surface of the housing, and the lowermost edge of the cup circumferentially surrounds an open bottom.

3. The light emitting device of claim 1, wherein the housing comprises a plastic material and at least the inner surface of the cup comprises a metal material.

4. The light emitting device of claim 3, wherein the cup is manufactured from a metal material.

5. The light emitting device of claim 1, wherein the cup is manufactured from a plastic material.

6. The light emitting device of claim 1, wherein the sidewall of the housing is continuous.

* * * * *